METHOD OF MAKING SEMICONDUCTOR DEVICE USING POLYCRYSTAL THIN FILM FOR IMPURITY DIFFUSION

Filed March 13, 1972

United States Patent Office
3,783,050
Patented Jan. 1, 1974

3,783,050
METHOD OF MAKING SEMICONDUCTOR DEVICE USING POLYCRYSTAL THIN FILM FOR IMPURITY DIFFUSION

Mitsuo Nanba, Kokubunji, Yukio Takano, Hoya, Hisayuki Higuchi, Kodairagakuen, and Michiyoshi Maki, Kokubunji, Japan, assignors to Hitachi, Ltd., Tokyo, Japan Filed Mar. 13, 1972, Ser. No. 234,011
Claims priority, application Japan, Mar. 12, 1971, 46/13,105
Int. Cl. H01l 7/34
U.S. Cl. 148—188 20 Clams

ABSTRACT OF THE DISCLOSURE

In a method of making semiconductor device there is formed an approximately 1μ thick P-conductivity type silicon polycrystal thin film layer having impurities P-conductivity type boron and electrically neutral IV group germanium in a specific region on an N-conductivity type silicon single crystal substrate, the specific resistance of which is 5 to 10Ω cm. A heat treatment is applied to the substrate at a high temperature, to thereby simultaneously diffuse the boron and germanium impurities contained in the thin film layer into the substrate, thus forming a P-conductivity type impurity diffusion region which causes little lattice strain. Then phosphorus and germanium are simultaneously diffused into the P-conductivity type impurity diffusion region, forming an N-conductivity type impurity diffusion region causing little lattice strain.

BACKGROUND OF THE INVENTION

This invention relates to a method of making semiconductor devices, and more particularly to improvements in a method of making a semiconductor device using impurity diffusion.

DESCRIPTION OF THE PRIOR ART

A semiconductor device such as a transistor IC (Integrated Circuit) and LSI (Large Scale Integration) is fabricated in the prior art in such a manner that a certain number of regions of different conductivity types having various electrical properties are formed in a semiconductor substrate. These electrical properties are utilized to provide the semiconductor device with the desired functions.

This semiconductor device, however, has various problems associated with it. For example, when a large amount of impurity is diffused into the semiconductor substrate crystal to form the regions, lattice strain takes place since the atomic radius of the semiconductor substrate differs from that of the impurity, and this deteriorates the electrical characteristics of the semiconductor device.

To eliminate lattice strain, it is known in the art that another impurity having an atomic radius sufficient to compensate for the strain is diffused into the impurity-diffused region.

According to one known method of avoiding lattice strain caused when a large amount of phosphorus impurity is diffused into the substrate silicon, another impurity-tin, a group IV element, the atomic radius of which is larger than that of phosphorus and the conductivity type of which is the same as that of silicon, is diffused into a specific region of the substrate silicon, and then phosphorus is diffused into the tin-diffused region.

In this method, however, a heat treatment is applied to the element at such a high temperature so as to evaporate the tin in a hermetic tube and, as a consequence, the evaporated tin or other undesirable vapor produced during the process of the heat treatment acts thermodynamically on the substrate, to result in rough substrate surface or precipitation of the impurity such as tin out of the substrate. For this reason, it has been impossible in the prior art to realize characteristically desirable semiconductor devices with diffusion of IV group impurity such as tin.

SUMMARY OF THE INVENTION

An object of this invention is to provide a method of making semiconductor devices with desirable electrical characteristics free of the foregoing prior art drawbacks.

Another object of the invention is to provide a method of making semiconductor devices formed without causing lattice strain in the conduction region.

Still another object of the invention is to provide a method of making semiconductor devices using an impurity diffusion method in which the impurity concentration can easily be controlled.

Briefly, the method of this invention is characterized in that a polycrystalline thin film layer comprising an impurity of the desired conductivity type and another impurity, electrically neutral with respect to the substrate (i.e., an impurity causing no change in the conductivity type when it is diffused thereinto), is formed on the substrate at a relatively low temperature, and a high temperature heat treatment is applied to the substrate, whereby the impurities contained in the polycrystalline thin film layer are diffused into the substrate and, thus, an impurity diffusion region of a specific conductivity type is formed.

These and other objects, features and advantages of this invention will be more apparent from the following description when read in conjunction with the accompanying drawings.

DESCRIPTION OF THE PREFERRED EMBODIMENTS

FIGS. 1 through 8 illustrate steps of making a transistor according to this invention.

Figure 1:
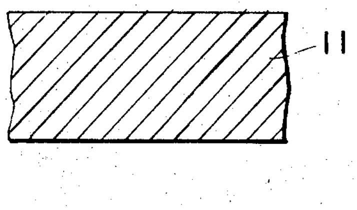
FIGS. 1 through 8 illustrate steps of making a semiconductor device according to this invention.

An N-conductivity type silicon single crystal semiconductor substrate with a specific resistance of about 5 to 10Ω cm., as shown in FIG. 1, is prepared.

Figure 2:
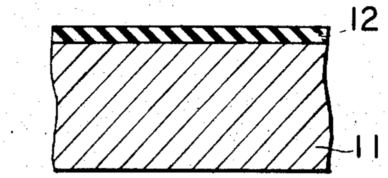

A polycrystalline thin film layer 12, as shown in FIG. 2 is formed by vapor growth at a relatively low temperature, namely at about 600 to 650° C. In this process, boron and germanium are added to the layer 12. It is necessary to determine specific impurity concentration values for these boron and germanium additives as will later be described. One example of directly forming the silicon polycrystal thin film layer is discussed below. The flow rates of hydrogen ($H_2$) gas bubbling through liquid silicon tetrachloride ($SiCl_4$), boron tribromide ($BBr_3$) and germanium tetrachloride ($GeCl_4$) are approximately 10 l./min., 0.0023 l./min., and 0.01 l./min., respectively. The resultant gases are mixed with hydrogen gas supplied at the rate of about 30 l./min. Then the gases are introduced into a reaction quartz tube kept at a temperature of about 600 to 650° C. In this reaction tube, a thin silicon film is formed. The resulting concentration of the impurities contained in the thin film are approximately $10^{19}$ atoms/cm.$^3$ (boron) and $4.5\times10^{19}$ atoms/cm.$^3$ (germanium).

Boron is an impurity used for obtaining the desired conductivity type, and germanium is also an impurity being electrically neutral with respect to Group IV silicon of the substrate. The type and concentration of the impurity added to the polycrystalline thin film are determined to be adequate for each specific purpose of the invention.

In general, when an impurity atom whose atomic radius differs from that of the silicon atom of the substrate is introduced into the silicon lattice in a substitutional position, crystal strain is produced around said impurity atom. It is known that the magnitude of this crystal strain depends on the product of the ratio of atomic radius of the impurity atom to that of the silicon atom, and on the concentration of the impurity. When this atomic radical ratio is expressed by the lattice contraction coefficient, i.e., 1-(atomic radius of impurity atom/atomic radius of silicon atom)$^3$/ atomic concentration, the magnitude of the strain produced around the impurity atom is determined by the product of the lattice contraction coefficient and the impurity concentration. The lattice contraction coefficient, as defined, is known, for example, according to the references to Cohen, Solid State Electronics, volume 10 (Pergamon Press 1967), pages 33–37 and McQuhae et al., Solid-State Electronics, volume 15, pages 259–264. To be more specific, the atomic radii and lattice contraction coefficients are tabulated below for certain typical impurities.

| | Atomic radius (A.) | Lattice contraction coefficient |
|---|---|---|
| Impurity: | | |
| C | 0.77 | +14.0 |
| B | 0.88 | +12.0 |
| P | 1.10 | +3.4 |
| Si | 1.17 | 0 |
| As | 1.18 | −0.52 |
| Ge | 1.22 | −2.7 |
| Ga | 1.26 | −5.0 |
| Al | 1.26 | −5.0 |
| Sb | 1.36 | −12.0 |
| Sn | 1.40 | −14.0 |
| Pb | 1.46 | −19.0 |
| Bi | 1.46 | −19.0 |

In the table, the first column indicates the kind of impurity the second column the atomic radius in terms of angstrom units (A.), such as found in the text book, The Nature of the Chemical Bond by L. Pauling (3d edition, Cornell University Press, 1960) at pages 244–249, and the third column the lattice contraction coefficient in the units of $10^{24}$ cm.$^3$ atom. In the third column the positive sign indicates that the impurity gives rise to negative lattice strain in the substrate silicon, and the negative sign denotes that the impurity produces positive lattice strain therein. Since the lattice strain in the crystal substrate is determined by the product of the lattice contraction coefficient and the impurity concentration, the concentration of the impurity germanium to compensate for the strain caused by boron is given by the following equation.

$$\text{Ge Impurity Concentration} = \frac{(\text{lattice contraction coefficient of boron}) \times (\text{impurity concentration of boron})}{\text{lattice contraction coefficient of germanium}}$$

When the concentration of boron is $1\times10^{19}$ atoms/scm.$^3$, the germanium impurity concentration should be $4.4\times10^{19}$ atoms/cm.$^3$ from the above equation. This example is for forming the base region. For forming the emitter region using the impurity phosphorus, the concentration of which is $5\times10^{20}$ atoms/cm.$^3$, the germanium impurity concentration should be $6.3\times10^{20}$ atoms/cm.$^3$ from the above equation, so as to compensate for the strain caused by phosphorus.

Figure 3:
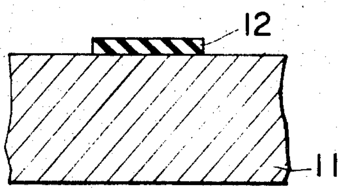

Then, as shown in FIG. 3, the polycrystalline thin film layer is etched to a specific pattern by the known photoetching technique. In this process, the etching is carried out several times faster in the polycrystalline thin film layer than in the silicon single crystal. Therefore, a known etching solution such as the solution of a nitric acid system, a fluoric acid system and the like may readily be used for this etching process.

Figure 4:
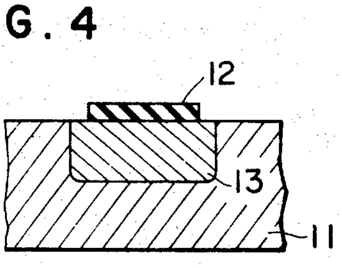

As shown in FIG. 4, the silicon substrate is heat-treated in the atmosphere at a high temperature (about 1000° C.) where clean nitrogen gas is constantly supplied at the flow rate of about 1 l./min. thereby forming a P-conductivity type diffusion region 13 the impurity surface concentration of which is about $10^{19}$ atoms/cm.$^3$ being equal to the impurity concentration of boron contained in the polycrystal thin film layer. The surface concentration of germanium is nearly the same as the concentration of the impurity contained in the polycrystal thin film layer, and the impurity is diffused to the depth of the junction. The diffusion depth of a Group IV element into the substrate need not be strictly accurate; it may be either deeper or shallower than the junction as long as the impurity diffusion is sufficient to reduce the lattice strain. Thus, corresponding to the pattern of the polycrystalline thin film layer 12 on the substrate, the impurity diffusion region 13 is formed into a specific shape on the substrate. The atomic radius of germanium diffused into the substrate is 1.22 A. which is larger than that (1.17 A.) of silicon, to result in positive lattice strain in the substrate. While, on the other hand, the atomic radius of boron diffused into the substrate is 0.88 A. which is smaller than that of silicon, to result in a negative lattice distortion in the substrate. In the diffusion region 13, where the two impurities are coexistent, the lattice distortions are compensated by each other, and therefore, lattice defects are minimized. The lattice strains are mutually compensated on the following principle.

For example, an impurity atom such as boron whose atomic radius is 0.88 A. or phosphorus whose atomic radius is 1.10 A., which is smaller than that (1.17 A.) of silicon, and whose conductivity type is different from that of the silicon substrate, and also an atom being electrically neutral with respect to the silicon substrate, such as germanium, whose atomic radius is 1.22 A., or tin whose atomic radius is 1.40 A., which is larger than that of silicon, are simultaneously diffused into the silicon substrate, whereby on conduction region is formed. In this structure, as described above, the negative lattice strain caused in the silicon substrate by one of the atoms, whose atomic radius is smaller than that of silicon, is compensated by the positive lattice strain caused by the other atom whose atomic radius is larger than that of silicon. On the other hand, when arsenic whose atomic radius is 1.18 A. or antimony whose atomic radius is 1.36 A., which is larger than that of silicon is diffused into the substrate as a conduction type impurity atom, the positive lattice strain produced in the substrate due to the impurity atom is compensated by an electrically neutral atom such as carbon whose atomic radius (0.77 A.) is small. Measured by a bicrystalline spectrometer method, the crystal lattice strain in the conduction region having two types of impurities was less than $10^{-5}$, in contrast to that in the order of $10^{-4}$ to $10^{-3}$, in the conduction region formed by conventional diffusion methods. According to the invention, as described above, the electrically neutral atom must be adequately controlled when diffused. In this embodiment, the substrate and the polycrystalline thin film layer are considered to be of nearly the same substance and, hence, there is no difference in the thermal expansion coefficient between the polycrystalline thin film layer and the substrate, and the impurities in the polycrystalline thin film layer are diffused into the substrate without being precipitated in the boundary between the polycrystal thin film layer and the substrate. Also, because the lattice parameter (5.43059 A.) is nearly equal between the polycrystalline thin film layer and the substrate, no external stress is produced between the polycrystal thin film layer and the substrate during the process of heat treatment. Hence, lattice strain or defects due to such external stress cannot be produced in the boundary between the polycrystalline thin film layer and the substrate or in the diffusion layer.

In this example, silicon is used as the material of the substrate and the polycrystalline thin film layer as well. Instead of silicon, a compound semiconductor such as GaP, GaAs and GaAsP may be used. When such a compound semiconductor is used, the relative lattice contraction coefficient is to be determined according to tabulated data (as shown in the foregoing table) giving the values of lattice strain on various impurities added to the compound semiconductor. According to the invention, the substrate and the polycrystalline thin film layer may be made of mutually different semiconductors such as silicon and gallium arsenide.

Figure 5:
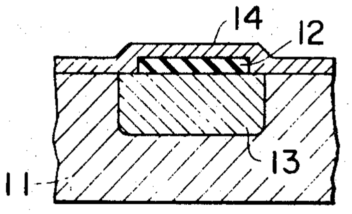

Further, an N-conductivity type diffusion region is formed in the diffusion region 13 in the same manner as described above. More specifically, as shown in FIG. 5, an N-conductivity type region 14 is formed on the silicon single crystal 11, P-conductivity type region 13 and polycrystal thin film layer 12. To this effect, phosphorus and germanium which are electrically neutral with respect to the substrate are used as the different conductivity type impurities. These elements are treated at a suitable gas flow ratio, for example, 0.8:1, determined for the necessary impurity concentration, whereby a polycrystal layer 14 is formed. A concerete example of this process is shown below.

Figure 6:
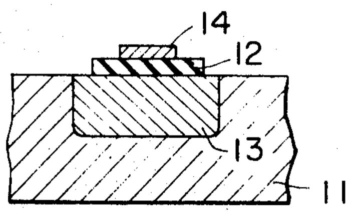
Figure 7:
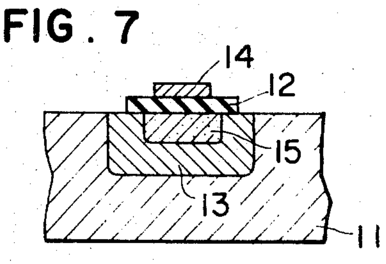
Figure 8:
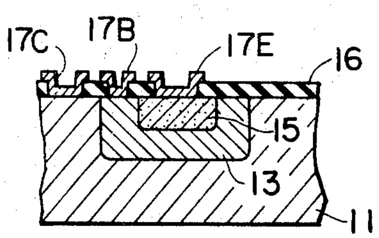

The flow rates of hydrogen gas bubbling through liquid silicon tetrachloride ($SiCl_4$), phosphorus oxychloride ($POCl_3$) and germanium tetrachloride ($GeCl_4$) are about 10 l./min. 0.1 l./min., and 0.125 l./min., respectively. These gases are introduced into a reaction tube kept at a temperature of about 600 to 650° C., whereby the crystal is grown on the substrate. Under this condition, a polycrystalline thin film layer 14 containing a phosphorus impurity with a concentration of about $5\times10^{20}$ atoms/cm.$^3$ and germanium impurity with a concentration of about $6.3\times10^{20}$ atoms/cm.$^3$ can be obtained. Then, as shown in FIG. 6, the polycrystalline thin film layer 14 is etched to the desired pattern by the known etching techniques. The sample is heat-treated in the atmosphere at about 1000° C. for about one-half hour, whereby an N-conductivity type diffusion region 15 is formed in the P-conductivity type diffusion region 13, as shown in FIG. 7. Then, an insulation film 16, electrodes 17E, 17B and 17C for the emitter base, and collector, respectively, are formed, as shown in FIG. 8 by a known element producing technique, whereby a transistor is formed.

In this embodiment, a polycrystalline layer is formed on the whole surface of the substrate, and then the polycrystalline layer is etched to the desired pattern.

It is apparent that the invention is not limited to this embodiment. For example, a diffusion mask about 0.3 to 1$\mu$ thick of a specific pattern is formed of a suitable insulative material such as an $SiO_2$ film and an $Si_3N_4$ film, and a polycrystalline thin film layer is formed on the diffusion mask.

In this case, the diffusion mask must be good enough to mask the specific conductivity type impurities.

In the foregoing embodiment, a silicon substrate is used. Instead, a single crystal semiconductor such as germanium, or a compound semiconductor such as GaP, GaAs and GaAsP may be used for the substrate. Also, in the above embodiment, germanium, which is electrically neutral with respect to the silicon substrate, is used as the impurity. Instead, a group IV element such as tin (Sn) and carbon (C) may be used. The invention is also applicable to substrates of other semiconductors. In any case, the impurity used must be of a specific conductivity type determined according to the atomic radius and impurity concentration as described above. The foregoing embodiment gives particulars of a method of forming the emitter region. Instead, the diffusion for forming the emiter region may be done by the conventional method if the Group IV impurity contained in the base region is thoroughly doped beforehand.

According to this invention, as has been described above, a polycrystal thin film layer comprising the same material as that of the substrate, to which layer an impurity of a certain specific conductivity type and another impurity being electrically neutral with respect to the substrate are added, is formed on the substrate, and a heat treatment is applied to the substrate, thereby diffusing into the substrate at least two types of the impurities contained in the polycrystalline thin film layer and thus compensating for lattice strain in the diffusion region of the specific conductivity type. According to the invention therefore, transistors having desirable electrical characteristics can be obtained. Furthermore, the method according to this invention makes the known epitaxial growth technique applicable at a low temperature. In other words, the temperature in the production process can be easily controlled, and the quantity of impurity to be doped and the thickness of the polycrystalline thin film layer can also be readily controlled. Still further, because the polycrystalline thin film layer is formed at a low temperature, the impurity contained in the thin film layer cannot immediately be diffused into the substrate. Hence, it is easy to control the junction depth of the diffusion region merely by controlling the succeeding heat treatment. By virtue of these useful effects, the method of this invention assures the realization of highly stable semiconductors devices operable with desirable electrical characteristics.

While the principles of the invention have been described above in connection with specific embodiments, and particular modifications thereof, it is to be clearly understood that this description is made only by way of example and not as a limitation on the scope of the invention.

We claim:

1. In a method of making a semiconductor device the steps comprising:

forming, in a specified region on a semiconductor substrate, having one conductivity type, a polycrystalline thin film layer of the same material as that of said semiconductor substrate and having a first impurity of an opposite conductivity type to said semiconductor substrate and a second impurity which is electrically neutral with respect to said semiconductor substrate and which is of a different material from that of the semiconductor substrate; and diffusing said first and second impurities in said polycrystalline thin film layer into said semiconductor substrate, thus forming an impurity diffusion region of a conductivity type which depends upon said first impurity, whereby lattice strain caused in said impurity diffusion region has a value less than $10^{-5}$.

2. A method of making a semiconductor device according to claim 1, wherein said first impurity is an impurity selected from the group consisting of Group III–A and Group V–A elements, and said second impurity is an impurity selected from the group consisting of Group IV–A elements.

3. A method of making a semiconductor device according to claim 2, wherein said Group IV–A impurity is selected from among the group consisting of germanium, tin and carbon.

4. A method of making a semiconductor device according to claim 1, wherein the concentration of said first impurity corresponds to a value obtained by dividing the absolute value of the product of the concentration of said second impurity and the lattice contraction coefficient of said second impurity with respect to said semiconductor substrate by the lattice contract coefficient of said first impurity with respect to said semiconductor substrate.

5. A method of making a semiconductor device according to claim 1, wherein said step of forming said polycrystalline thin film layer comprises the steps of forming said layer on a diffusion mask formed of an insulation film disposed on said semiconductor substrate.

6. A method of making a semiconductor device according to claim 5, wherein said diffusion mask is formed of a film selected from the group consisting of a $SiO_2$ film and a $Si_3N_4$ film.

7. A method of making a semiconductor device according to claim 1, wherein said semiconductor substrate is made of silicon.

8. A method of making a semiconductor device according to claim 7 wherein said first and second impurities contained in said polycrystalline silicon thin film layer are boron and germanium, respectively, and the concentration of boron corresponds to a value obtained by dividing the absolute value of the product of the lattice contraction coefficient of germanium with respect to the silicon substrate and the concentration of germanium by the absolute value of the lattice contraction coefficient of boron with respect to silicon substrate.

9. A method of making a semiconductor device according to claim 7, wherein said first and second impurities contained in said polycrystalline silicon thin film layer are phosphorus and germanium respectively, and the concentration of phosphorus corresponds to the value obtained by dividing the absolute value of the product of the lattice contraction coefficient of germanium with respect to the silicon substrate and the concentration of germanium by the absolute value of the lattice contraction coefficient of phosphorus with respect to the silicon substrate.

10. A method of making a semiconductor device according to claim 1, wherein said step of forming comprises flowing a carrier hydrogen gas through liquid silicon tetrachloride, boron tribromide and germanium tetrachloride, at respective predetermined flow rates to provide gases containing the constituents of said layer.

11. A method of making a semiconductor device according to claim 10, wherein said gases are introduced into a reaction tube to form said layer maintained at a temperature of from about 600° C. to about 650° C.

12. A method of making a semiconductor device according to claim 11, wherein said step of diffusing is carried out at a temperature of about 1000° C.

13. A method of making a semiconductor device according to claim 1, wherein said step of forming said thin film layer is carried out at a temperature of from about 600° C. to about 650° C.

14. A method of making a semiconductor device according to claim 13, wherein said step of diffusing is carried out at a temperature of about 1000° C.

15. In a method of making a semiconductor device the steps comprising:

forming in a specified region of an impurity diffusion region having one conductivity type on a semiconductor substrate a polycrystalline thin film layer of the same material as that of said semiconductor substrate and having a first impurity of an opposite conductivity type to said impurity diffusion region and a second impurity which is electrically neutral with respect to said semiconductor substrate and which is of a different material from that of said semiconductor substrate; and diffusing said first and second impurities from said polycrystalline thin film layer into said impurity diffusion region, thus forming an impurity diffusion region of a conductivity type which depends upon said first impurity, whereby lattice strain caused in said impurity diffusion region has a value less than $10^{-5}$.

16. A method of making a semiconductor device according to claim 15, wherein the concentration of said second impurity corresponds to a value obtained by dividing the absolute value of the product of the concentration of said first impurity and the lattice contraction coefficient of said first impurity with respect to said semiconductor substrate by the lattice contraction coefficient of said second impurity with respect to said semiconductor substrate.

17. A method of making a semiconductor device according to claim 15, wherein said first impurity is an impurity selected from the group III–A and Group V–A elements, and said second impurity is an impurity selected from the group consisting of Group IV–A elements.

18. A method of making a semiconductor device according to claim 17, wherein said substrate is made of silicon.

19. A method of making a semiconductor device according to claim 18, wherein said group IV–A impurity is selected from the group consisting of germanium, tin and carbon.

20. A method of making a semiconductor device according to claim 1, wherein the concentration of said second impurity corresponds to a value obtained by dividing the absolute value of the product of the concentration of said first impurity and the lattice contraction coefficient of said first impurity with respect to said semiconductor substrate by the lattice contraction coefficient of said second impurity with respect to said semiconductor substrate.

References Cited

UNITED STATES PATENTS

| | | | |
|---|---|---|---|
| 3,502,517 | 3/1970 | Sussmann | 148—175 |
| 3,562,022 | 2/1971 | Shifrin | 148—1.5 |
| 3,664,896 | 5/1972 | Duncan | 148—187 |
| 3,502,515 | 3/1970 | McMullen et al. | 148—175 |
| 3,245,002 | 4/1966 | Hall | 148—190 U X |
| 3,326,729 | 6/1967 | Sigler | 148—187 X |
| 3,345,222 | 10/1967 | Nomura et al. | 148—187 X |

OTHER REFERENCES

Edel et al.: "Stress Relief by Counterdoping," IBM Technical Disclosure Bulletin, vol. 13, No. 3, August 1970. N.Y.

E. H. Sargent & Co.: "Table of Periodic Properties of the Elements," Springfield, N.J., 1962.

GEORGE T. OZAKI, Primary Examiner

U.S. Cl. X.R.

148—187, 190; 317—235 R